United States Patent
Hill

[19]

[11] Patent Number: 6,100,186
[45] Date of Patent: Aug. 8, 2000

[54] METHOD OF SELECTIVELY FORMING A CONTACT IN A CONTACT HOLE

[75] Inventor: Chris W. Hill, Boise, Id.

[73] Assignee: Micron Technology, Inc., Boise, Id.

[21] Appl. No.: 09/060,164

[22] Filed: Apr. 14, 1998

[51] Int. Cl.⁷ .............................................. H01L 21/4763
[52] U.S. Cl. .................... 438/648; 438/649; 438/630; 438/682; 438/683; 438/664
[58] Field of Search ............................ 438/622, 627–630, 438/637, 648–651, 660–664, 666, 672, 682–683, 688; 257/754–757, 768–770

[56] References Cited

U.S. PATENT DOCUMENTS

| | | | |
|---|---|---|---|
| 4,884,123 | 11/1989 | Dixit et al. | 438/643 |
| 4,994,410 | 2/1991 | Sun et al. | 438/649 |
| 4,998,157 | 3/1991 | Yokoyama et al. | 438/643 |
| 5,242,860 | 9/1993 | Nulman et al. | 438/653 |
| 5,652,180 | 7/1997 | Shinriki et al. | 438/620 |
| 5,672,543 | 9/1997 | Chang et al. | 438/653 |
| 5,725,739 | 3/1998 | Hu | 438/658 |
| 5,776,830 | 10/1997 | Sumi et al. | 438/643 |
| 5,801,425 | 8/1997 | Kuroi et al. | 257/383 |
| 5,858,873 | 3/1997 | Vitkavage et al. | 438/626 |
| 5,926,737 | 8/1997 | Ameen et al. | 438/649 |

OTHER PUBLICATIONS

Wolf et al. "Silicon Processing for the VLSI Era" vol. 1, pp. 392–392, 1986.

Kamoshida, Kazuyoshi and Kunio, Saito, "Self–aligned TiN Formation by $N_2$ Plasma Bias Treatment of $TiSi_2$ Deposited by Selective Chemical Vapor Deposition," *Jpn. J.Appl. Phy.* vol. 36 (1997) pp. 642–647, Part 1, No. 2, Feb., 1997.

*Primary Examiner*—Charles Bowers
*Assistant Examiner*—Thanh Nguyen
*Attorney, Agent, or Firm*—Dorsey & Whitney LLP

[57] ABSTRACT

A contact is selectively formed in a contact hole in an insulating layer deposited on a silicon substrate. The contact hole exposes a portion of the substrate. The contact is formed by selectively forming a first layer of titanium silicide in the contact hole on the exposed portion of the substrate. A layer of titanium nitride is then selectively formed on the first layer of titanium silicide. A second layer of titanium silicide is thereafter selectively formed on the layer of titanium nitride to form the contact.

25 Claims, 3 Drawing Sheets

METHOD OF SELECTIVELY FORMING A CONTACT IN A CONTACT HOLE

TECHNICAL FIELD

The present invention relates generally to integrated circuits, and more specifically, to a contact structure and a method of selectively forming such a contact in an integrated circuit.

BACKGROUND OF THE INVENTION

During the manufacture of integrated circuits, electrical components are formed on a semiconductor substrate through a number of process steps. For example, a typical process for forming metal oxide semiconductor ("MOS") transistors includes the steps of forming an oxide layer on a surface of a silicon substrate, masking portions of the oxide layer, removing unmasked portions of the oxide, and doping regions of the silicon substrate exposed by the removed portions of the oxide layer. After the formation of the MOS transistors and other desired components, the resulting structure is patterned to form contact holes over portions of the components. For example, a contact hole may be formed over a source or drain region of a MOS transistor. A contact is then formed by depositing a conductive layer in the contact holes to provide interconnection among the components fabricated on the substrate.

FIG. 1 illustrates a conventional contact hole 20 formed in an oxide layer 22 deposited on a surface of a silicon substrate 24. The contact hole 20 is formed by removing a portion of the oxide layer 22 by, for example, etching or other suitable process means. A small n+-type silicon region 26 is shown formed in the substrate 24 under the contact hole 20 and may correspond, for example, to a source or drain region of a MOS transistor (not shown in FIG. 1), as understood by one skilled in the art. A contact must be formed in the contact hole 20 to provide electrical connection between the n+-type region 26 and other components formed in the substrate 24. FIG. 2 illustrates the formation of a contact to the region 26 through an aluminum layer 28 deposited in the contact hole 20 and on the oxide layer 22 through known processes, such as physical vapor deposition (PVD). Although shown as being deposited directly on the silicon n+-type region 26, one skilled in the art will realize the aluminum layer 28 cannot be deposited directly on the region 26 due to the formation of an eutectic alloy at the silicon-aluminum junction of the region 26 and layer 28. As understood by one skilled in the art, the silicon-aluminum junction must be annealed to provide a good ohmic contact between the region 26 and layer 28. An ohmic contact is one that has linear voltage and current characteristics defined by Ohm's law, as understood by one skilled in the art. During this annealing, the eutectic alloy is formed from the silicon in the region 26 and the aluminum in the layer 28. The alloy may melt down into the substrate 24 beyond the region 26 as illustrated by the dotted line 32 and thereby destroy the region 26.

One solution to the eutectic alloy problem resulting at a silicon-aluminum junction is illustrated in FIG. 3. A barrier layer 34, such as titanium nitride (TiN), is deposited on the region 26 before the aluminum layer 28. The barrier layer 34 physically isolates the region 26 from the layer 28, preventing the silicon-aluminum eutectic alloy from forming as understood by one skilled in the art. Although the deposition of the barrier layer 34 prevents formation of the eutectic alloy, it also results in an increased resistivity of the contact and of the conductive layer 36 over the oxide layer 22. This is true because a composite contact layer 36 comprising the layers 28 and 34 has a higher resistivity than the resistivity of the aluminum layer 28 alone due to the higher resistivity of the titanium nitride layer 34.

FIG. 4 illustrates an alternative contact structure which eliminates the problems of the unwanted portions of the barrier layer 34 on the oxide layer 22. In FIG. 4, a titanium suicide $TiSi_2$ layer 38 is selectively formed on the surface of the n+-type region 26 through known selective processes, such as selective chemical vapor deposition ("CVD"). The formation of such a titanium silicide layer 38 is highly selective, with no titanium silicide being formed on the surface of the oxide layer 22. As shown in FIG. 4, the titanium silicide layer 38 extends beneath the surface of the substrate 24 and into the small n+-type region 26. This is true because formation of the titanium silicide layer 38 consumes some of the silicon in the n+-type region 26 as understood by those skilled in the art. The aluminum layer 28 is thereafter deposited on the surfaces of the oxide layer 22 and titanium silicide layer 38 to form the contact.

In the structure of FIG. 4, the formation of the aluminum layer 28 on the titanium silicide layer 38 again results in a eutectic alloy forming in the substrate region 26 due to the reaction of silicon in this region with aluminum from the layer 28. Such an alloy could extend down to the substrate region 24, thereby destroying the region 26, as shown by the dotted line 40. A titanium nitride barrier layer 34 could be deposited over the titanium silicide layer 38 and oxide layer 22 as previously described preventing the silicon-aluminum alloy from forming at the junction of the layers 28 and 38. However, the formation of such a barrier layer 34 undesirably increases the resistivity of the contact and the portions of the conductive layer over the oxide layer 22. To prevent these problems, additional process steps are required to remove the unwanted portions of the barrier layer. Alternatively, the thickness of the titanium silicide layer 38 may be increased so the alloy has farther to travel before entering and destroying the n+-type region 26. The allowable thickness of the titanium silicide layer 38 is limited, however, in that the amount of silicon consumed from the region 26 during formation of the layer 38 cannot be so great that the layer 38 extends through the region 26.

There is a need for selectively forming contacts in a semiconductor integrated circuit.

SUMMARY OF THE INVENTION

One embodiment of the present invention relates to a method for selectively forming contacts and the contact structure formed from such a method. The contact is formed in a contact hole in an insulating layer deposited on a silicon substrate. The contact hole exposes a portion of the silicon substrate. The method comprises the steps of selectively forming a first layer of titanium silicide in the contact hole on the exposed portion of the substrate. A layer of titanium nitride is selectively formed on the first layer of titanium silicide. A second layer of titanium silicide is selectively formed in the contact hole on the layer of titanium nitride. In one embodiment, the insulating layer is an oxide layer having a thickness ranging from one to two microns.

DETAILED DESCRIPTION OF THE INVENTION

Figure 1:
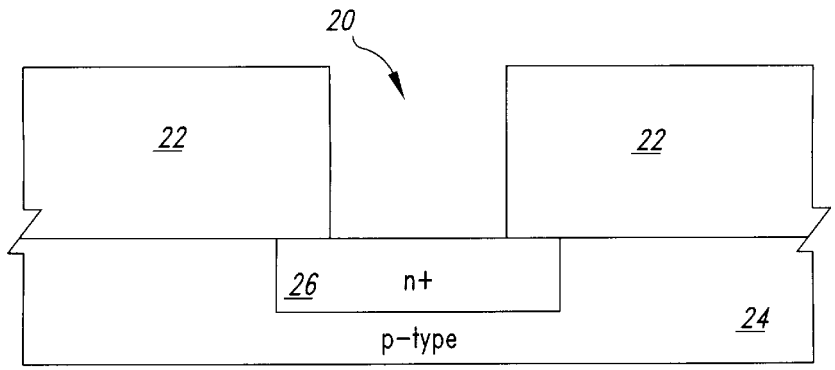
FIGS. 1–4 illustrate prior art embodiments of contact structures.
Figure 2:
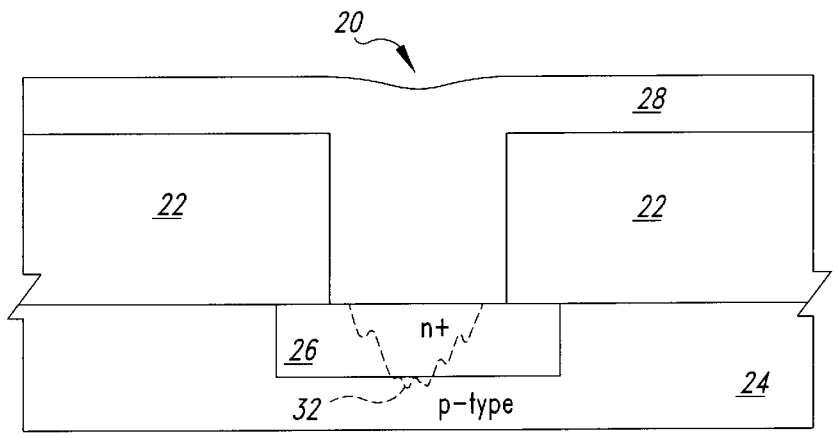
Figure 3:
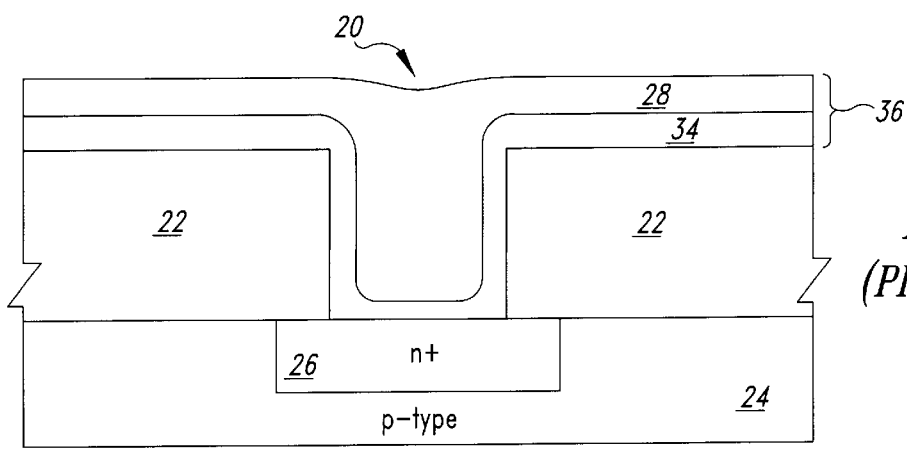
Figure 4:
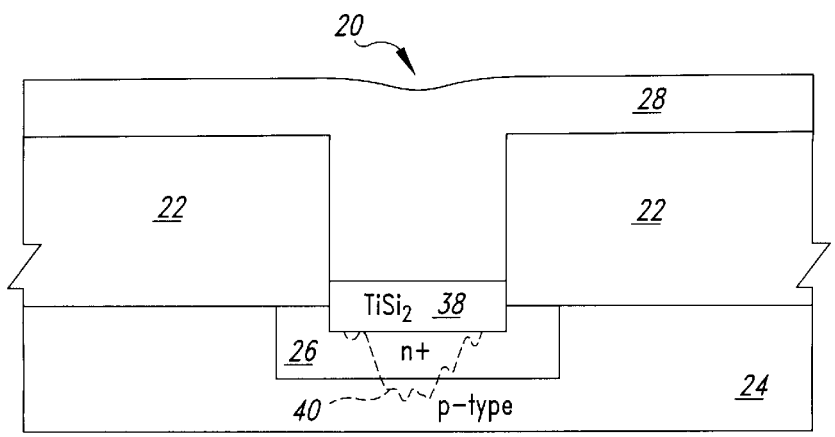
Figure 5:
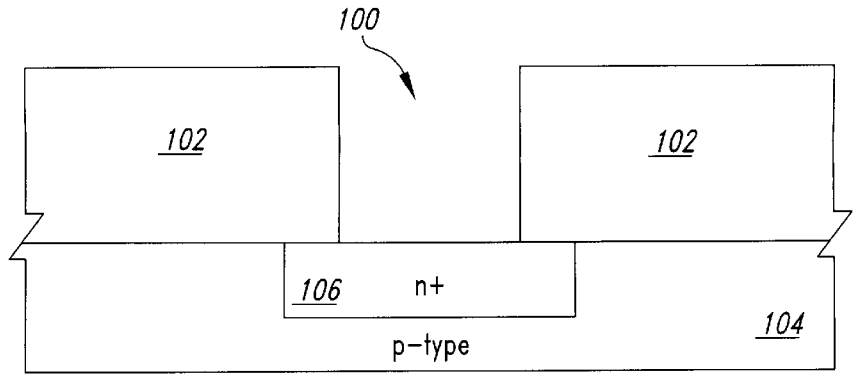
FIGS. 5–8 illustrate various stages of the formation of a contact structure according to one embodiment of the present invention.

FIGS. 5–8 illustrate the formation of a contact structure according to one embodiment of the present invention. In FIG. 5, a contact hole 100 is formed in an insulating layer 102 deposited on a surface of a p-type silicon substrate 104. The insulating layer 102 is typically silicon dioxide $SiO_2$ or other suitable type of insulating material, and is formed through deposition or thermally grown using conventional processes. The insulating layer 102 typically has a thickness ranging from approximately one to two microns. Although the substrate 104 is described as being p-type silicon, it may be either p-type or n-type silicon, as understood by one skilled in the art. An n+-type region 106 is shown formed in the substrate 104 beneath the contact hole 100 and corresponds, for example, to a drain or source region of a MOS transistor (not shown in FIG. 5) formed in the substrate 104.

Figure 6:
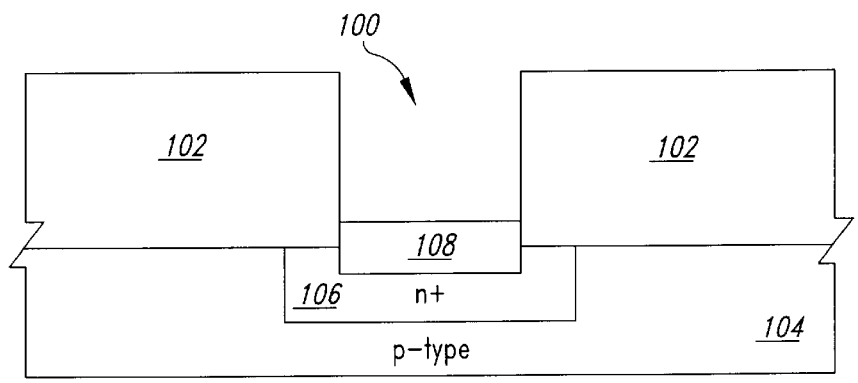

FIG. 6 illustrates the selective formation of a first titanium silicide $TiSi_2$ layer 108 on the portion of the n+-type region 106 exposed by the contact hole 100. The formation of the titanium silicide layer 108 is selective in that no titanium silicide is formed on the insulating layer 102 but only on the portion of the n+-type region 106 exposed by the contact hole 100. The layer 108 typically has a thickness ranging from approximately 200 to 1000 angstroms. As understood by one skilled in the art, a chemical vapor deposition ("CVD") process utilizing titanium tetrachloride $TiCl_4$ plus silane $SiH_4$ may be used for the selective formation of the titanium silicide layer 108. The CVD process may also utilize titanium tetrachloride plus dichlorosilane $SiH_2Cl_2$ to selectively form the titanium silicide layer 108, and other selective processes may also be utilized as understood by one skilled in the art.

Figure 7:
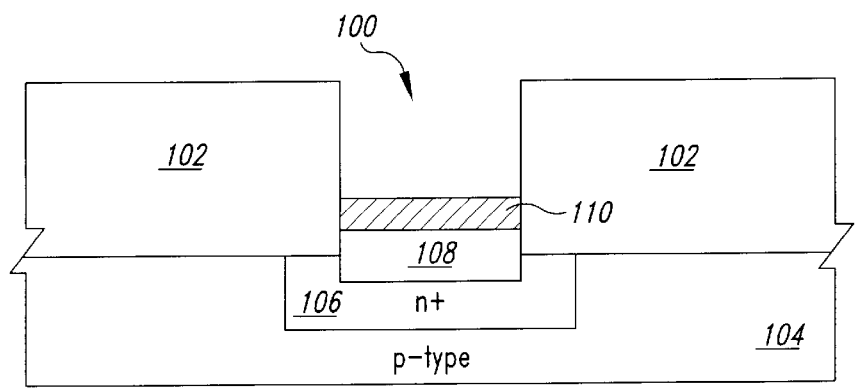

After selective formation of the titanium silicide layer 108, the surface of the layer 108 exposed by the contact hole 100 is converted into a titanium nitride TiN layer 110 as shown in FIG. 7. To form the titanium nitride layer 110, the surface of the titanium silicide layer 108 is exposed to a nitrogen source, such as nitrogen $N_2$ or ammonia $NH_3$, plus heat, as understood by one skilled in the art. Alternatively, nitrogen from a $N_2$ or $NH_3$ plasma may also be used in forming the titanium nitride layer 110. The formation of the titanium nitride layer 110 is again highly selective in that the layer 110 is formed only on top of the layer 108 and not on the insulating layer 102. Typically, the titanium nitride layer 110 has a thickness ranging from approximately 100 to 500 angstroms.

Figure 8:
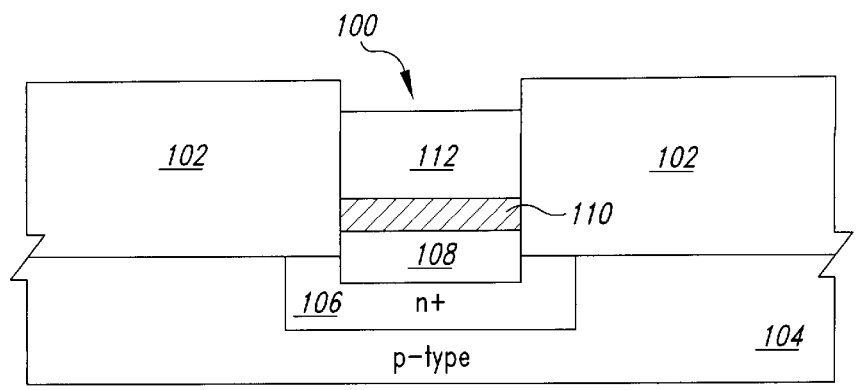
Figure 9:
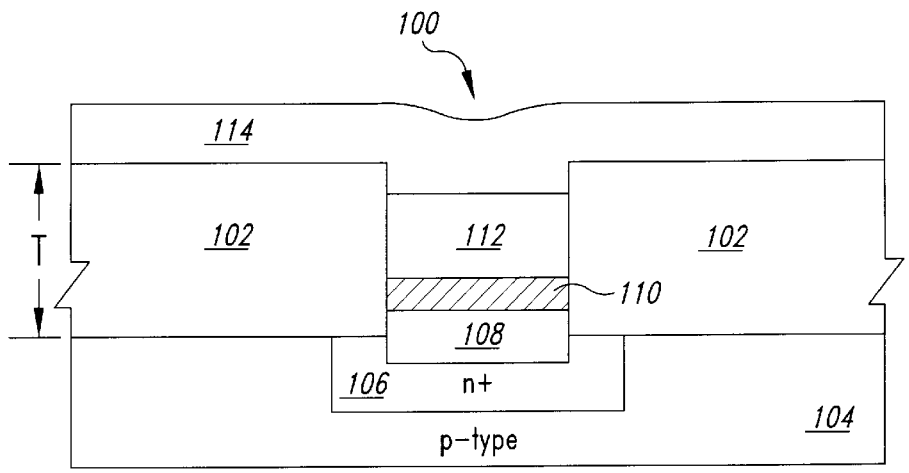
FIGS. 9–10 illustrates a potential problem in forming deep contact structures which is eliminated by the contact structure of FIGS. 5–8.

As shown in FIG. 8, after formation of the titanium nitride layer 110 a second layer of titanium silicide 112 is selectively formed in the contact hole 100 on the top surface of the layer 110. As during formation of the first titanium silicide layer 108, the formation of the second titanium silicide layer 112 is again highly selective with no titanium silicide forming on the insulating layer 102. The selective formation of the second titanium silicide layer 112 may utilize the same CVD process previously described with reference to the first titanium silicide layer 108. During formation of the second titanium silicide layer 112, it should be noted that no silicon from the layer 108 is consumed due to the presence of the titanium nitride barrier layer 110. Thus, the second titanium silicide layer 112 may be formed as thick as desired and, in FIG. 8, is shown as having a thickness such that the top surface of the layer 112 is just below the top surface of the insulating layer 102. As shown in FIG. 9, after formation of the second titanium silicide layer 112, a conductive layer 114, such as aluminum, is deposited on the top surfaces of the insulating layer 102 and second titanium silicide layer 112. The conductive layer 114 may be deposited using physical vapor deposition (PVD), evaporation, or other suitable processes as understood by one skilled in the art.

The embodiment of the present invention illustrated in FIGS. 5–9 provides the selective formation of a contact in any depth of insulating layer 102. Recall, that during the formation of the first titanium silicide layer 108, a portion of the silicon in the region 106 is consumed in forming the layer 108. Thus, the thickness of the layer 108 is limited by the thickness of the region 106 since not too much silicon from the region 106 may be consumed. In the present process, however, after formation of the first titanium silicide layer 108 the titanium nitride barrier layer 110 prevents further consumption of silicon from the layer 108. Thus the second titanium silicide layer 112 may be formed having any desired thickness. In FIG. 9, the insulating layer 102 is shown having a thickness T. When the thickness T of layer 102 is relatively large, the thickness of the second titanium silicide layer 112 may be increased accordingly to ensure proper formation of the conductive layer 114 in the contact hole 100 as will be described in more detail below.

Figure 10:
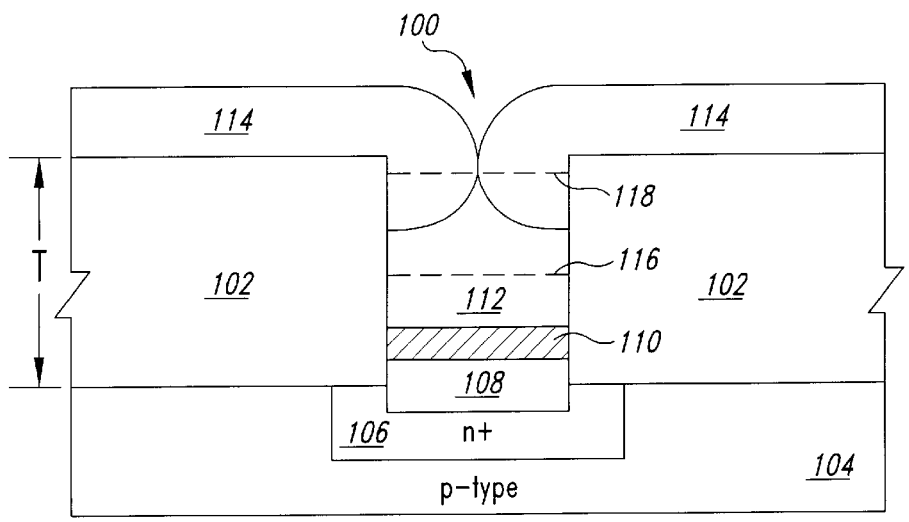

FIG. 10 illustrates a potential problem experienced in forming contacts in deep insulating layers 102. As shown in FIG. 10, if the second titanium silicide layer 112 is not present or has an insufficient thickness as indicated by the dotted line 116, when the conductive layer 114 is deposited it may deposit in the contact hole 100 as shown and fail to form the required contact. However, when the insulating layer 102 has a rather large thickness T, the thickness of the second titanium silicide layer 112 may be increased accordingly as indicated by the dotted line 118 in FIG. 10 thus enabling proper formation of the desired contact.

It is to be understood that even though various embodiments and advantages of the present invention have been set forth in the foregoing description, the above disclosure is illustrative only, and changes may be made in detail, and yet remain within the broad principles of the invention. Therefore, the present invention is to be limited only by the appended claims.

I claim:

1. A method for selectively forming a contact in a contact hole formed in an insulating layer deposited on a silicon substrate, the contact hole exposing a portion of the substrate, comprising the steps of:

selectively forming a first layer of titanium silicide in the contact hole on the exposed portion of the substrate;

selectively forming a layer of titanium nitride on the first layer of titanium silicide; and selectively forming a second layer of titanium silicide in the contact hole on the layer of titanium nitride.

2. The method of claim 1 wherein the first layer of titanium silicide has a thickness that is substantially less than a thickness of the second layer of titanium silicide.

3. The method of claim 1 wherein the first layer of titanium silicide has a thickness such that the silicon consumed from the substrate during formation of the first layer of titanium silicide is less than a depth of a doped region formed in the substrate under the contact hole.

4. The method of claim 1 wherein the step of forming a first layer of titanium silicide includes the step of forming a first layer of titanium silicide having a thickness ranging from approximately 200 to 1000 angstroms.

5. The method of claim 1 wherein the insulating layer is an oxide layer having a thickness ranging from one to two microns.

6. The method of claim 1 wherein the first layer of titanium silicide is deposited through chemical vapor deposition.

7. The method of claim 6 wherein the chemical vapor deposition process includes titanium tetrachloride (TiCl$_4$) and silane (SiH$_4$).

8. The method of claim 1 wherein the layer of titanium nitride is formed using a nitrogen source and heat.

9. The method of claim 8 wherein the nitrogen source is ammonia (NH$_3$).

10. The method of claim 1 wherein the layer of titanium nitride has a thickness ranging from approximately 100 to 500 angstroms.

11. The method of claim 1 wherein the second layer of titanium silicide is deposited through chemical vapor deposition.

12. The method of claim 1 wherein the chemical vapor deposition process includes titanium tetrachloride (TiCl$_4$) and silane (SiH$_4$).

13. A method for selectively forming a contact in a contact hole formed in an insulating layer deposited on a silicon substrate, the contact hole exposing a portion of the substrate, comprising the steps of:

selectively forming a first layer of titanium silicide in the contact hole on the exposed portion of the substrate;

selectively forming a layer of titanium nitride on the first layer of titanium silicide;

selectively forming a second layer of titanium silicide in the contact hole on the layer of titanium nitride; and forming a metal layer on the second layer of titanium silicide and on the insulating layer.

14. The method of claim 13 wherein the metal layer is an aluminum layer.

15. The method of claim 13 wherein the first layer of titanium silicide has a thickness that is substantially less than a thickness of the second layer of titanium silicide.

16. The method of claim 13 wherein the step of forming a first layer of titanium silicide includes the step of forming a first layer of titanium silicide having a thickness ranging from approximately 200 to 1000 angstroms.

17. The method of claim 13 wherein the first layer of titanium silicide has a thickness such that the silicon consumed from the substrate during formation of the first layer of titanium silicide is less than a depth of a doped region formed in the substrate under the contact hole.

18. The method of claim 13 wherein the insulating layer is an oxide layer having a thickness ranging from one to two microns.

19. The method of claim 13 wherein the first layer of titanium silicide is deposited through chemical vapor deposition.

20. The method of claim 13 wherein the chemical vapor deposition process includes titanium tetrachloride (TiCl$_4$) and silane (SiH$_4$).

21. The method of claim 13 wherein the layer of titanium nitride has a thickness ranging from approximately 100 to 500 angstroms.

22. The method of claim 13 wherein the layer of titanium nitride is formed using a nitrogen source and heat.

23. The method of claim 22 wherein the nitrogen source is ammonia (NH$_3$).

24. The method of claim 13 wherein the second layer of titanium silicide is deposited through chemical vapor deposition.

25. The method of claim 24 wherein the chemical vapor deposition process includes titanium tetrachloride (TiCl$_4$) and silane (SiH$_4$).

* * * * *